(12) United States Patent
Widjaja et al.

(10) Patent No.: US 7,800,159 B2
(45) Date of Patent: Sep. 21, 2010

(54) ARRAY OF CONTACTLESS NON-VOLATILE MEMORY CELLS

(75) Inventors: Yuniarto Widjaja, San Jose, CA (US);
Henry A. O'M'Mani, Milpitas, CA (US); Prateep Tuntasood, San Jose, CA (US); Bomy Chen, Cupertino, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 204 days.

(21) Appl. No.: 11/923,515

(22) Filed: Oct. 24, 2007

(65) Prior Publication Data
US 2009/0108328 A1    Apr. 30, 2009

(51) Int. Cl.
*H01L 29/788* (2006.01)

(52) U.S. Cl. .............. 257/316; 257/315; 257/319; 257/E29.3; 257/E27.103

(58) Field of Classification Search ......... 257/314–320, 257/E29.3, E27.103
See application file for complete search history.

(56) References Cited

U.S. PATENT DOCUMENTS

| | | | |
|---|---|---|---|
| 5,883,409 | A | 3/1999 | Guterman et al. |
| 6,103,573 | A | 8/2000 | Harari et al. |
| 6,151,248 | A * | 11/2000 | Harari et al. ............ 365/185.14 |
| 6,420,231 | B1 | 7/2002 | Harari et al. |
| 6,747,310 | B2 | 6/2004 | Fan et al. |
| 6,861,315 | B1 | 3/2005 | Chen et al. |
| 6,894,339 | B2 * | 5/2005 | Fan et al. ..................... 257/314 |
| 6,936,883 | B2 | 8/2005 | Chen et al. |
| 6,992,929 | B2 | 1/2006 | Chen et al. |
| 7,046,552 | B2 | 5/2006 | Chen et al. |
| 7,190,018 | B2 | 3/2007 | Chen et al. |
| 7,217,621 | B2 | 5/2007 | Chen et al. |
| 7,598,561 | B2 * | 10/2009 | Chen et al. .................. 257/315 |

OTHER PUBLICATIONS

Ma, et al., "A Dual-bit Split-Gate EEPROM (DSG) Cell in Contactless Array for Single-Vcc High Density Flash Memories," IEEE, 1994, pp. 3.5.1-3.5.4.

* cited by examiner

*Primary Examiner*—Anh Phung
*Assistant Examiner*—Allison P Bernstein
(74) *Attorney, Agent, or Firm*—DLA Piper LLP (US)

(57) ABSTRACT

A plurality of non-volatile memory cell units are arranged in rows and columns in a single crystalline semiconductor substrate of a first conductivity type. Each cell unit has a first region of a second conductivity type in the substrate along the planar surface, and a second region of the second conductivity, spaced apart from the first region, with a channel region therebetween. The channel region has a first portion adjacent to the first region, a third portion adjacent to the second region and a second portion therebetween. A first and second floating gates are over the first portion and third portion respectively and are insulated therefrom. A first and second control gates are over the first and second floating gates respectively and are capacitively coupled thereto. A first and second erase gates are over the first and second regions respectively and are insulated therefrom. A word line is over the second portion and is insulated therefrom. Electrical contacts to the array are made along the extremities of the array.

4 Claims, 5 Drawing Sheets

ARRAY OF CONTACTLESS NON-VOLATILE MEMORY CELLS

TECHNICAL FIELD

The present invention relates to an array of nonvolatile memory cells, and more particularly, wherein the array is a contactless array.

BACKGROUND OF THE INVENTION

Nonvolatile memory cells using a floating gate to store charges thereon are well known in the art. See for example, U.S. Pat. Nos. 6,747,310; 6,992,929; 5,883,409; 6,747,310; 7,046,552; 7,217,621. See also U.S. Pat. Nos. 6,936,883; 7,190,018; 6,861,315; 6,420,231; 6,151,248 and 6,103,573. See also "A Dual-bit Split-Gate EEPROM (DSG) Cell in Contactless Array for Single Vcc High Density Flash Memories" by Ma et al., published in IEDM 1994, pp. 57-60.

SUMMARY OF THE INVENTION

Accordingly, in the present invention, an array of nonvolatile memory cells comprises a substantially single crystalline semiconductor substrate of a first conductivity type, having a planar surface. A plurality of non-volatile memory cell units are arranged in a plurality of rows and columns in the substrate. Each cell unit comprises a first region of a second conductivity type in the substrate along the planar surface. A second region of the second conductivity type is in the substrate along the planar surface, spaced apart from the first region. A channel region is between the first region and the second region. The channel region is characterized by three portions: a first portion, a second portion and a third portion, with the second portion between the first portion and the third portion, and the first portion adjacent to the first region, and the third portion adjacent to the second region. A first floating gate is over the first portion of the channel region, and is insulated therefrom. A first control gate is over the first floating gate and is capacitively coupled thereto. A first erase gate is over the first region and is insulated therefrom. A word line is over the second portion and is insulated therefrom. A second erase gate is over the second region and is insulated therefrom. A second floating gate is over the third portion and is insulated therefrom. A second control gate is over the second floating gate and is capacitively coupled thereto. Cell units in the same row share the word line in common. Cell units in the same column share the first region in common to one side, the first erase gate in common, the second region in common to the other side and the second erase gate in common, and the first and second control gates in common. Cell Units in the same column share the first control gate in common and the second control gate in common. Electrical contacts to the array are made only along the extremities of the array to the first region and to the second region.

In another embodiment of the present invention, a virtual junction non-volatile memory cell comprises a substantially single crystalline semiconductor substrate of a first conductivity type, having a planar surface. A first erase gate is over a first area of the substrate and is insulated therefrom. Application of a voltage to the first erase gate produces a first junction in the first area of the substrate. A second erase gate is over a second area of the substrate and is insulated therefrom. The second area is spaced apart from the first area. Application of a voltage to the second erase gate produces a second junction in the second area of the substrate, defining a channel region between the first junction and the second junction. The channel region has three portions: a first portion, a second portion and a third portion, with the second portion between the first portion and the third portion. The first portion is adjacent to the first junction, and the third portion is adjacent to the second junction. A first floating gate is over the first portion, and is insulated therefrom. A first control gate is over the first floating gate and is capacitively coupled thereto. A word line is over the second portion and is insulated therefrom. A second floating gate is over the third portion and is insulated therefrom. A second control gate is over the second floating gate and is capacitively coupled thereto. An array of such virtual junction cells is also disclosed.

DETAILED DESCRIPTION OF THE INVENTION

Figure 1:
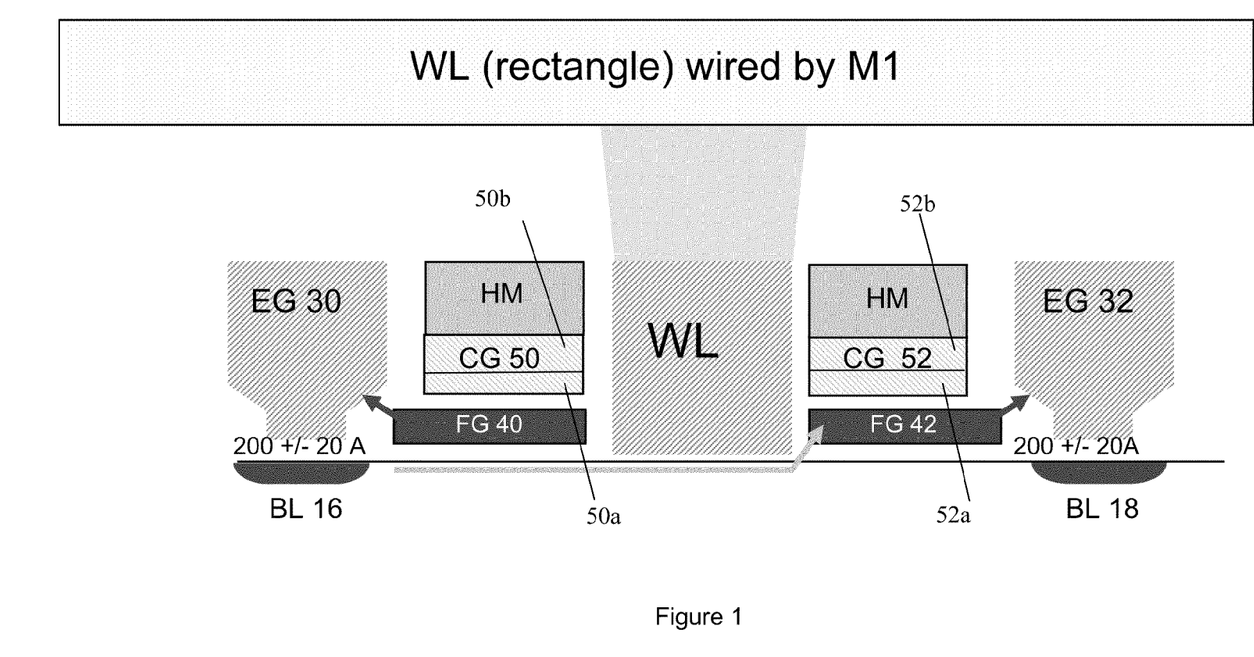
FIG. 1 is a cross-sectional view of a first embodiment of a planar bidirectional cell capable of being used in the array of the present invention.

Referring to FIG. 1, there is shown a cross-sectional view of a first embodiment of a nonvolatile memory cell 10 for use in the array 80 of the present invention.

The cell 10 comprises a substantially single crystalline semiconductor substrate 12, such as single crystalline silicon, having a planar surface 14. The substrate 12 is of a first conductivity type, such as P type. The cell 10 has a first region 16 of a second conductivity type, such as N type, if the substrate 12 is of P type. The cell 10 also has a second region 18 of the second conductivity type, spaced apart from the first region 16. A channel region 20 is between the first region 16 and the second region 18, and has three portions: a first portion 22, a second portion 24 and a third portion 26. the second portion 24 lies between the first portion 22 and the third portion 26. the first portion 22 is adjacent to the first region 16. the third portion 26 is adjacent to the second region 18.

A first erase gate 30 is positioned over the first region 16, and is insulated therefrom. A second erase gate 32 is positioned over the second region 18 and is insulated therefrom. A first floating gate 40 is positioned over the first portion 22 of the channel region 20 and is insulated therefrom. A second floating gate 42 is positioned over the third portion 26 of the channel region 20 and is insulated therefrom. A first control gate 50 is on the first floating gate 40 and is capacitively coupled thereto. In the preferred embodiment, the first control gate 50 has two parts: a polysilicon portion 50a, and a layer of silicon nitride 50b on the polysilicon 50a. A second control gate 52 is on the second floating gate 42 and is capacitively coupled thereto. In the preferred embodiment, the second control gate also has two parts: a polysilicon portion 52a, and a layer of silicon nitride 52*b* on the polysilicon 50*a*. Finally, a word line 60 is on the second portion 24 of the channel region 20 and is insulated therefrom. The memory cell 10 is a bidirectional memory cell having two floating gates 40/42 for each cell 10.

Figure 2:
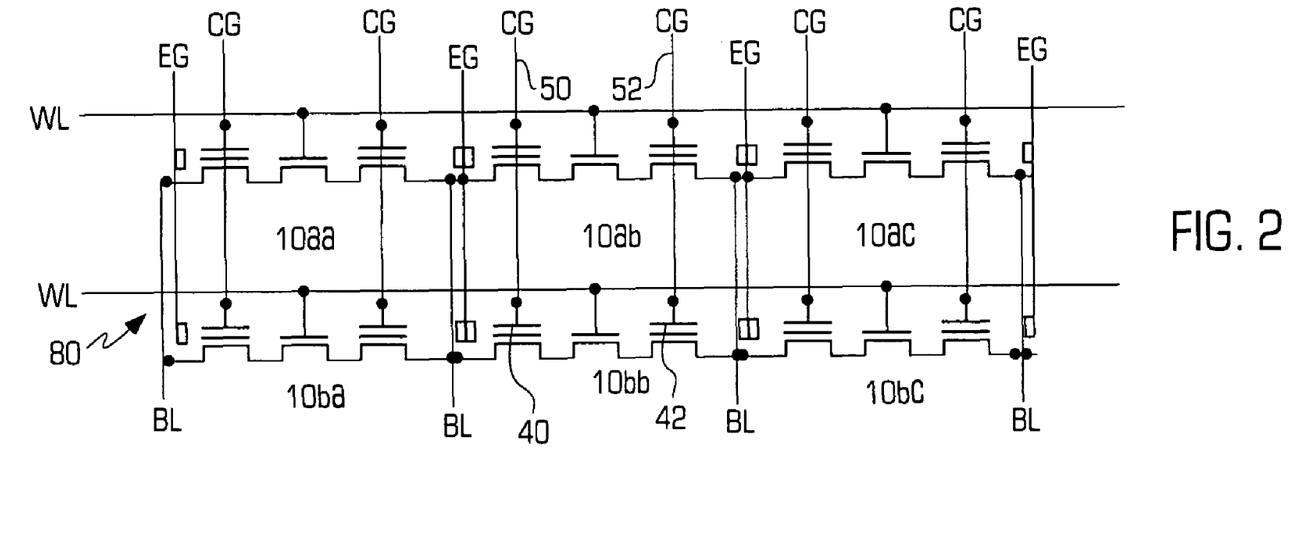
FIG. 2 is a circuit diagram of the first embodiment of the array of the present invention using the first embodiment of a planar cell shown in FIG. 1.

Referring to FIG. 2 there is shown an array 80, of non-volatile memory cells 10 of the type shown in FIG. 1, of the present invention. The array 80 has a plurality of cells 10 arranged in a plurality of rows and columns. As is well known and understood in the art, the term "rows" and "columns" may be interchangeably used. The array 80 shown in FIG. 2 comprises an array 80 of two rows of cells 10 with three cells 10 in each row or three columns of cells 10. Thus, the cells are designated 10*aa*, 10*ab*, 10*ac*, 10*ba*, 10*bb*, and 10*bc*. The array of cells 10 is connected as follows: Within the same row, the word line 60 is connected to all the cells 10 in common. Within the same column, for example column containing cells 10*ab* and cell 10*bb*, the first regions 16 are connected in common to one side. In addition, the second regions 18 are connected in common to the other side. It should be noted that between rows in the junctions regions 16 and 18, there are no isolation regions. Thus, the first region 16 and second region 18 extend from one row to another (in and out of the page of the embodiment shown in FIG. 1). Further, the first erase gates 30 are connected in common, as well as the second erase gates 32 are connected in common. Finally, the first control gates 50 are connected in common, and the second control gates 52 are connected in common. Thus, a first region 16 and an erase gate 30 are first region and first erase gate, respectively, to the memory cells to one side, and are the "second region" and "second erase gate" respectively to the memory cells on the other side. The array 80 is a contactless array. By that it is meant there are no contacts or plugs made to either the first region 16 or the second region 18 to each cell 10. Rather, the electrical connection to the first region 16 and the second region 18 are connect to the array 80 along the extremity of the array 80. By eliminating contacts to each cell 10, it allows a smaller size cell. Further, the elimination of electrical contacts to each cell 10 also eliminates one major cause of failure, due to shorting between the various structures, such as between the word line 60 and the bit line plug to contact the first region 16 or the second region 18. The array 80 is an AND array 80 of non-volatile memory cells 10

In the operation of the array 80 of the present invention, the operations are as follows. Let us assume that the operation is that of read on the cell 10*bb*, on the first floating gate 40. The voltages applied may be as follows. (as one of ordinary skill in the art appreciates, the magnitude of the voltage depends on the process and lithography size used to fabricate the array 80). The selected word line 60 for the cell 10*bb* is applied with a voltage of Vdd. The unselected word line is applied with a ground voltage. The selected first control gate 50 is applied with a zero voltage. The second control gate 52 is applied with a voltage of about 6 volts to pass the current through the third portion of the channel region 20 irrespective of whether the second floating gate 42 is charged or not. The first region 16 is applied with about 1 volts, while the second region 18 is applied with zero volts. Preferably, the erase gates 30 and 32 are biased as follows: second erase gate 32, which is adjacent to the unselected second floating gate 42, is biased at Vdd, while the first erase gate 30, which is adjacent to the selected first floating gate 40 is maintained at ground. The application of the voltage Vdd to the second erase gate 32 results in additional capacitive coupling to the second floating gate 42, making the third portion 26 of the channel region 20 conducting regardless of the state of charge on the second erase gate 42. Under the foregoing described conditions, if the first floating gate 40 is negatively charged, then no current would pass through the first portion 22 of the channel region 20. However, if the first floating gate 40 is not negatively charged, then a current would be able to pass through the first portion 22. Further, since the word line 60 is applied with a positive voltage, then the second portion 24 of the channel region 20 would also pass current therethrough. Finally, with the application of a high positive voltage to the second control gate 52, the third portion 26 of the channel region 20 is on irrespective of the state of charge of the second floating gate 42. Thus, whether current passes between the first region 16 and the second region 18 is determined by the state of charge on the first floating gate 40. To read the second floating gate 42, the voltages on the first control gate 50 and the second control gate 52 are reversed. In addition, the voltages on the first region 16 and the second region 18 are also reversed.

There are two ways to program a cell 10, such as cell 10*bb*, of the array 80 of the present invention. In the source side injection method the following voltages are applied. Let us assume that the second floating gate 42 is to be programmed. A voltage, such as Vgp (or +1.6 volts), sufficient to turn on the second portion 24 of the channel region 20 for the cell 10*bb*, is applied to the word line 60. The second control gate 52 is applied with a high voltage, such as +11 volts. A pass voltage, such as 6 volts is applied to the first control gate 50. Thus, irrespective of the state of charge of the first floating gate 40, a current would flow through the first portion 22 of the channel region 20. A high voltage, such as +5 volts is applied to the second region 18. A programming current, such as Iprog is applied to the first region 16. The first region 16 is the source of the current that would be programmed into the second floating gate 42. The preferred bias on the erase gates 30/32 is as follows: first erase gate 30 which is adjacent to the first floating gate 40 which is not being programmed is biased at Vdd, while the second erase gate 32, which is adjacent to the second floating gate 42, which is being programmed is biased at +6 volts. As discussed previously, the application of the voltage Vdd to the first erase gate 30 causes additional capacitive coupling to the first floating gate 40 to occur such that the first portion 22 of the channel region 20 underneath the first floating gate 40 is turned on irrespective of the state of charge stored on the first floating gate 40.

In the operation of programming by source side injection, the channel region 20 is turned on, because the first portion is turned on by the voltage applied to the first control gate 50. The second portion 24 of the channel region 20 is turned on because of the voltage applied to the word line 60. The third portion 26 of the channel region 20 is turned on by the high voltage applied to the second control gate 52. A positive voltage applied to the second region 18 is sufficient to attract the electrons from the first region 16. As the electrons traverse the channel region 20, they are attracted by the sudden increase in the voltage at the junction between the second portion 24 and the third portion 26 of the channel region 20 and are attracted to the second floating gate 42 because of the high voltage from the second control gate 52 capacitively coupled thereto. The electrons then "jump" across the insulation region between the planar surface 14 and the second floating gate 42, and the second floating gate 42 is thus programmed. To program the first floating gate 40 by the source side injection method, the voltages on the first and second control gates 50 and 52 are reversed. In addition, the voltages on the first and second regions 16 and 18 are reversed.

A second way to program the second floating gate 42 is by Fowler Nordheim tunneling of charges from the channel region 20 to the second floating gate 42. The voltages applied are as follows: The selected word line 60, such as WL2, is supplied with Vdd. The second control gate 52 is supplied with a high voltage such as +12 v. The first control gate 50 is supplied with Vdd, thereby preventing the first floating gate 40 from being programmed. The first region 16 and the second region 18 are both supplied with zero volts. With no voltage differential between the first region 16 and the second region 18, no current would flow in the channel region 20. Electrons from the channel region 20 and in particular from the third portion 26 of the channel region 20 would tunnel from that portion 26 through the insulation layer above the planar surface 14 and onto the second floating gate 42, thereby programming the second floating gate 42.

To erase the selected cell 10bb, the following voltages are applied. The selected word line 60, such as WL2 is supplied with zero or ground voltage. The first and second control gates 50 and 52 are both supplied with ground voltage. The first and second regions 16 and 18 are also supplied with ground voltage. The first erase gate 30 and the second erase gate 32 are supplied with an erase voltage HV, such as +12 v. Electrons from the first and second floating gate 40 and 42 would tunnel from those floating gates through the insulating region and onto the erase gates 30 and 32. It should be noted that it is not necessary to apply HV to both the first erase gate 30 and the second erase gate 32. The erase voltage HV can be applied singularly to either of the erase gates, 30 or 32. Further, the erase voltage HV when applied (for example to second erase gate 32) would attract electrons from the second floating gate 42 of cell 10bb as well as from the first floating gate 40 of the cell 10bc. Finally, the application of the erase voltage HV to the second erase gate 32, would erase the second floating gates 42 of each of the cells 10bb, and 10ab and all the other cells in the same column, as well as the first floating gates 40 of cell 10ac and cell 10bc.

Figure 3:
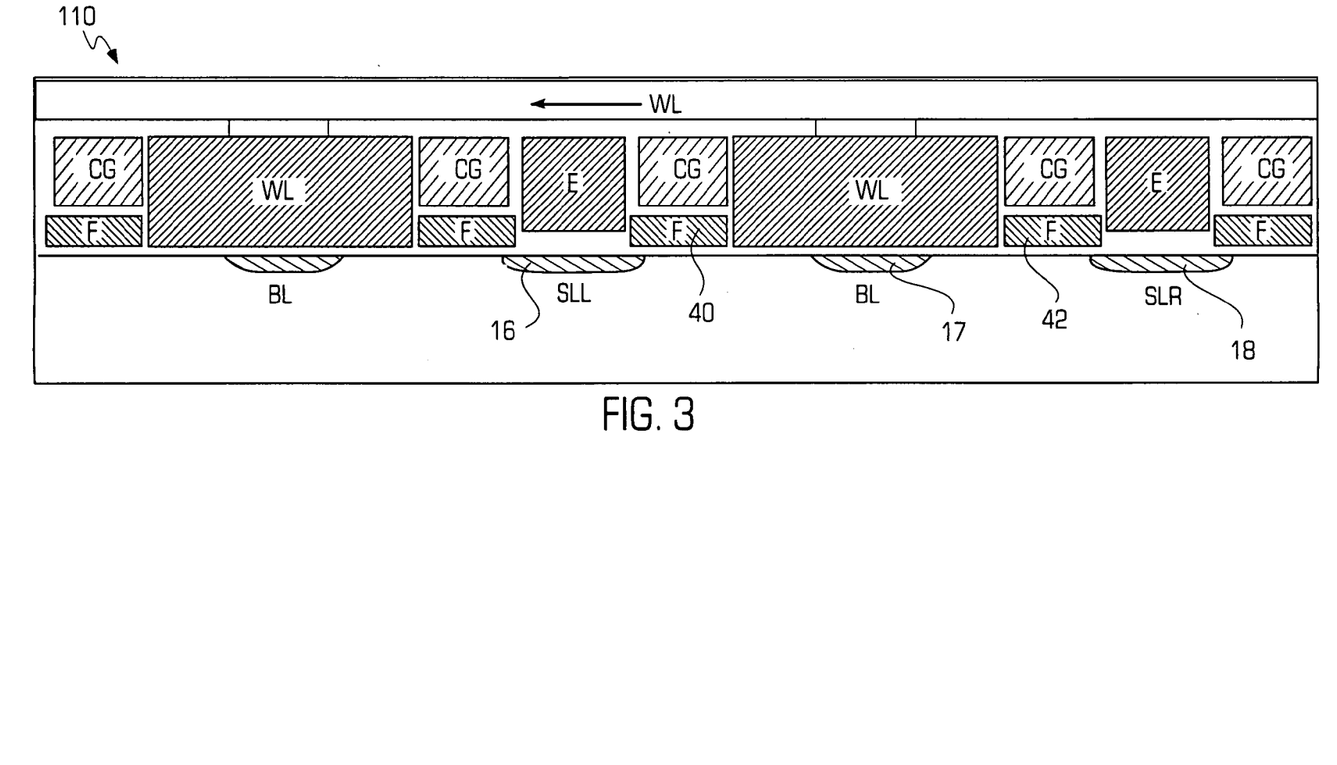
FIG. 3 is a cross sectional view of a second embodiment of a planar bidirectional cell capable of being used in the array of the present invention.

Referring to FIG. 3 there is shown a cross sectional view of a plurality of non-volatile memory cell units 110 for use in the array 180 of the present invention. Each memory cell unit 110 is nearly identical to the memory cell 10 shown in FIG. 1. Thus, the same reference number will be used for identical parts. The memory cell unit 110 is different from the memory cell 10 in that there is a third region 17 located in the second portion 24 of the channel region 20. Each memory cell unit 110 comprises two memory cells: 110a and 110b. First memory cell 110a comprises a first region 16, a third region 17, a first erase gate 30, a first floating gate 40, and a first control gate 50, the first portion 22 of the channel region 20, and the second portion 24 of the channel region 20. Second memory cell 110a comprises a second region 18, the third region 17, a second erase gate 32, a second floating gate 42, and a second control gate 52, the third portion 26 of the channel region 20, and the second portion 24 of the channel region 20. The word line 60 is common to both the first memory cell 110a and the second memory cell 110b. Hereinafter, each memory cell 110a or 110b shall be referred to as the memory cell 110. Thus, each memory cell 110 is only one-half of the cell 10 shown in FIG. 1. Furthermore, although the cell 10 is bidirectional, the cell 110 is not bidirectional.

Figure 4:
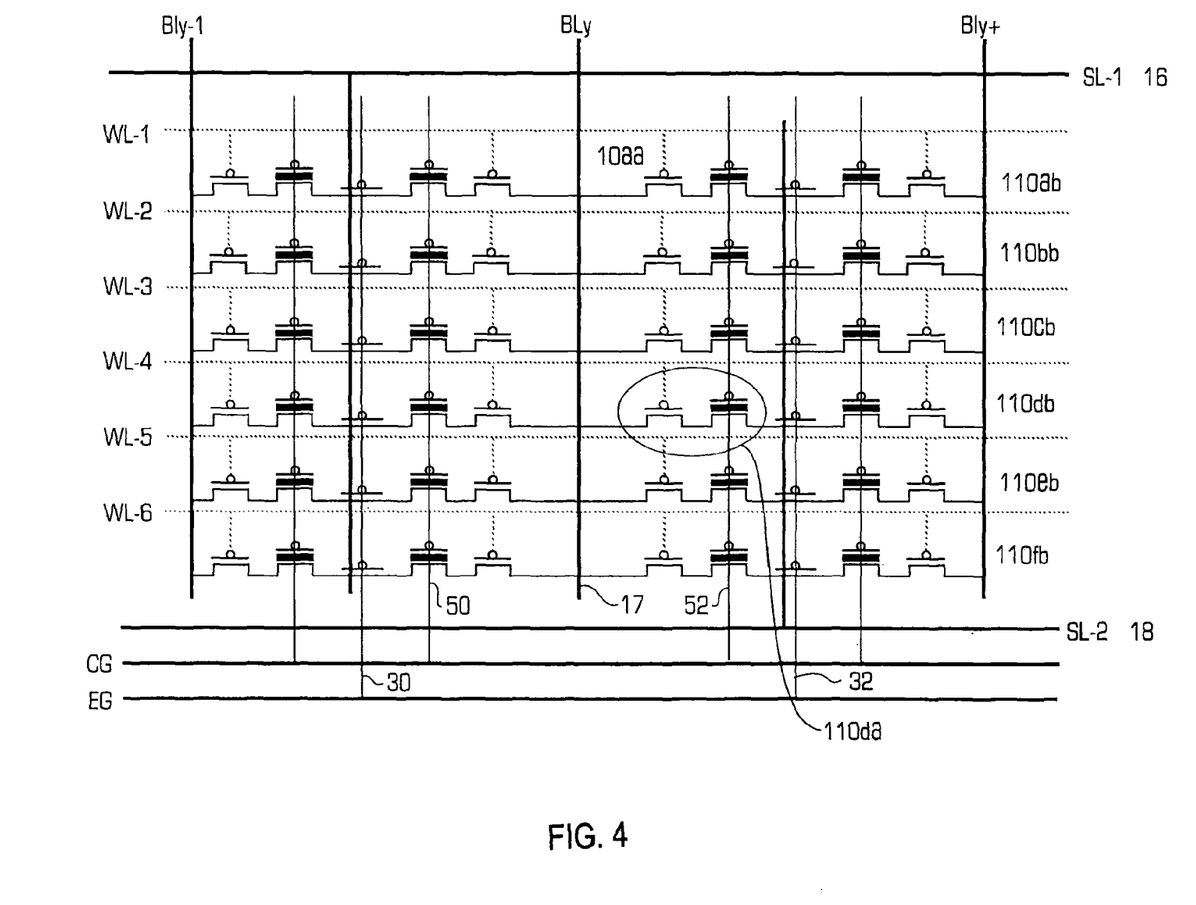
FIG. 4 is a circuit diagram of the second embodiment of the array of the present invention using the second embodiment of a planar cell shown in FIG. 3.

As a result, the interconnection of the cells 110 to form the array 180 of the present invention shown in FIG. 4 is nearly identical to the array 80 of the present invention shown in FIG. 2. The only difference is that a common bit line connects all the third regions 17 of the cells 110 that are in the same column. Although the "CG" line shown in FIG. 4 appears to connect to the first and second control gates 50 and 52, it is for illustration only. In reality, the line that connects the first control gates 50 of cells 110 in the same column, is not connected to the same line that connects to the second control gates 52 of cells 110 in the same column. In addition, although it appears that the "EG" line also connects the first and second erase gates 30/32, again it is for illustration only. In reality, the first erase gates 30 in the same column are not electrically connected to the second erase gates 32 of the same or adjacent column. Finally, although the word line 60 is a single structure in FIG. 3, it is shown schematically in FIG. 4 as being the gate of two separate transistors separated by the bit line 17 connecting the third regions 17. Similar to the array 80 shown in FIG. 2, in the array 180 there are no isolation junctions between rows of cells 110. Thus, the first region 16, the second region 18, and the third region 17 extend from one row to another (in and out of the page of the embodiment shown in FIG. 3). Further, the array 180 is a contactless array. Similar to the array 80, there are no contacts or plugs made to either the first region 16, or the third region 17 to each cell 110. Rather, the electrical connection to the first region 16 and the third region 17 are connect to the array 180 along the extremity of the array 180. The advantages of a contactless array are noted as hereinabove.

The voltages for the operation of the array 180 of the present invention are as follows. Assume that the operations described hereinafter apply to the floating gate 42 in the memory cell 110da in the array 180.

In the read operation, let us assume again that it is desired to read the state of charge of the floating gate 42 in the memory cell 110da. The voltages supplied are as follows. The voltage supplied to the first source line 16 is left floating. The voltage supplied to the second source line 18 connecting all the second regions 18 of all the memory cells 110 in the same column as the memory cell 110da are supplied with zero volts. As a result, all of the other first and second source lines 16 and 18 respectively are left floating and supplied with zero volts, respectively. The selected word line, WL-4, is supplied with Vdd, which can be +3 v. All of the unselected word lines, such as WL-1, WL-2, WL-3, WL-5, and WL-6 are supplied with zero volts. The control gate 52 to all the memory cells 110 in the same column as the selected memory cell 110da are supplied with 1.4V. The control gate of all the other cells 110 is supplied with zero volts. The erase gate 30/32 to all of the memory cells 110 in the array 180 are supplied with zero volts. Finally, the bit line 17 connecting all of the third regions 17 of all the memory cells 110 in the same column as the selected memory cell 110da (Bly) is supplied with Vr, which can be approximately +1 volts. The bit line 17 to all of the memory cells 110 to all of the other columns are at zero volts.

Under the foregoing voltages, the voltage on the selected word line WL-4 turns on the second portion 24 of the channel region 20 for the selected memory cell 110da. All of the other memory cells 110, such as 110ca, in the same column but different row, would not have the second portion 24 of the channel region 20 turned on. The voltage on the control gate 52 turns on the third portion 26 of the channel region 20, if the floating gate 42 is not negatively charged. If the floating gate 42 is negatively charged, the third portion 26 in the channel region 20 for the selected memory cell 110da would not turn on. In this manner with a voltage differential between the bit line 17 and the second source line 18, current would pass in the channel region 20 of the selected memory cell 110da if the floating gate 42 is not negatively charged, in a quantity greater than if the second floating gate 42 were negatively charged. Thus, detection of the current quantity would determine the state of charging of the floating gate 42. As for the adjacent floating gate 40 of the selected memory cell 110da, because the control gate 50 is at zero volts, the first portion 22 of the channel region 20 would not be conducting even if the floating gate 40 is not charged. Furthermore, since the first source line 16 is left floating, it minimizes any possible current flow between the third region 17 and the first region 16 through the second portion 24 and the first portion 22 of the channel region 20 of the memory cell adjacent to the selected memory cell 110da.

To program the floating gate 42 of the selected memory cell 110da, the following voltages are applied. The second source line 18 connecting the second region 18 of all the memory cells 110 in the same column as the memory cell 110da are supplied with +5 volts. Zero volts is supplied to all other source lines including the first source line 16. The selected word line WL-4 is supplied with 1.6 volts. All of the other unselected word lines, such as WL-1, WL-2, WL-3, WL-5, and WL-6 are supplied with zero volts. The control gate 52 is supplied with a high voltage, such as +11 volts. All of the other control gates including the control gate 50 is supplied with zero volts. The erase gate 32 connecting to the erase gate 52 of the selected memory cell 110da is supplied with +5 volts. This is to provide additional capacitive coupling with the floating gate 42, to increase the vertical field thereby improving the programming speed. All of the other erase gates, including the erase gate to the memory cells 110 in the unselected column are supplied with zero volts. The bit line 17 supplied to the third region 17 of the selected memory cell 110da is supplied with programming current of Ip. All of the other bit lines 17 in the unselected columns are supplied with an inhibit voltage of Vinh, which can be +2v.

With the foregoing voltages and current, the action of programming can be seen as follows. The portion of the second portion 24 of the channel region between the third region 17 and the second region 18 is turned on by the voltage supplied to WL-4. The third portion of the channel region 26 is also turned on by the high voltage applied to the second control gate 52. with the channel region 20 between the third region 17 and the second region 18 turned on, electrons will flow from the third region 17 to the second region 18. as the electrons near the junction of the second portion 24 and the third portion 26 of the channel region 20, they experience an abrupt attraction to the second floating gate 42, which is capacitively coupled by the high voltage applied to the second control gate 52. The electrons would jump across the insulation between the surface 14 and the second floating gate 42, and program the second floating gate 42.

Finally, to erase floating gate 42 of the selected memory cell 110da, the following voltages are applied. The first and second source lines 16/18 to all the memory cells 110 are supplied with zero volts. The word line 60 for all the selected and unselected rows of memory cells are supplied with zero volts. The control gates 50/52 for all of the selected and unselected columns are supplied with zero volts. The bit line 17 for all the selected and unselected columns of memory cells 110 are supplied with zero volts. The erase gate 52 for the selected memory cell 110da is supplied with an erase voltage, such as +11 volts. For all the other erase gates zero volts is supplied. Under these conditions, all of the floating gates 42 of all the memory cells 110 in the same column as the selected memory cell 110da are erased at the same time.

Figure 5:
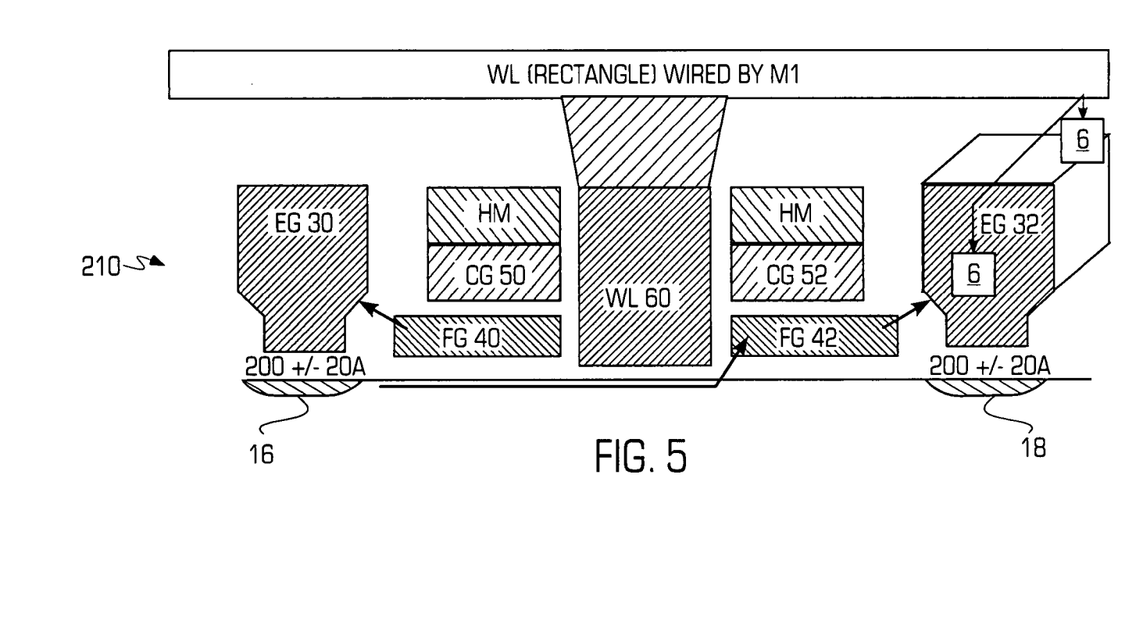
FIG. 5 is a cross sectional view of a third embodiment of the array of the present invention wherein the array is an array of virtual junction cells.
Figure 6:
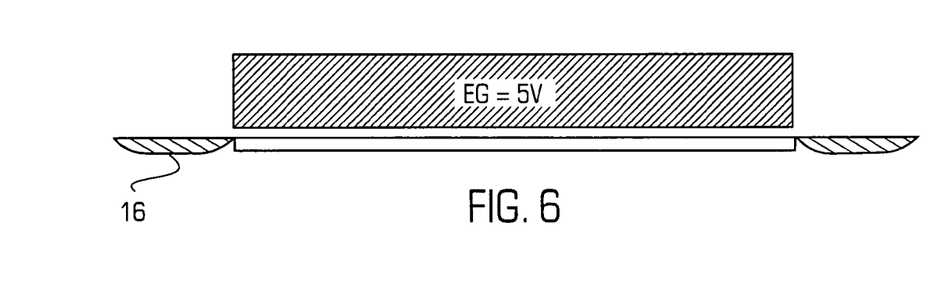
FIG. 6 is a cross-sectional view of an erase gate taken along the line 6-6 of FIG. 5, showing he induced junction as well as the physical junction along the extremities of the array.

Referring to FIG. 5, there is shown a cross section view of a memory cell 210 of the present invention. The memory cell 210 is very similar to the memory cell 10, shown in FIG. 1. Therefore, the same numerical reference will be used for like parts. The memory cell 210 is the same as the memory cell 10 except the memory cell 210 does not have a physical first region 16 and a physical second region 18. In all other aspects, the memory cell 210 has the same structural features as the memory cell 10. Because the first erase gate 30 and the second erase gate 32 are positioned over a region (16 and 18, respectively) of the substrate 12, when a voltage is applied to either the first erase gate 30 or the second erase gate 32, a junction is induced ("induced junction") along the surface 14 of the substrate 12 "beneath" the first and second erase gates 30 and 32 respectively. Thus, as shown in FIG. 5 are first induced junction 16 and second induced junction 18. With the induced junctions 16/18, the operations of the memory cell 210 is similar to the operation of the memory cell 10. Voltages can be applied to the induced junctions 16/18 in the following manner. Referring to FIG. 6 there is shown a region 16 of a second conductivity type in the substrate 12. The region 16 is located along the extremities of the array 80 and is aligned with the induced junction 16 caused by one of the erased gate 30 or 32. Electrical connections are made to the array 80 at these second regions. Thus, the region 16 along the extremity of the array 80 is a physical junction to which electrical contacts can be made. When induced junction 16 is produced by a voltage applied to the first erase gate 30/32, then the application of a voltage to the region 16 can cause that voltage to be supplied to the induced injunction 16/18.

The memory cells 210 are connected in an array in the same manner as that for the array 80 shown and described in FIG. 2. Further the operation of an array 80 of memory cells 210 is similar to the operation of an array of memory cells 10. The array 80 with memory cells 210 is also a contactless array. In addition, similar to the array 80 of memory cells 10, the array 80 of memory cells 210 is also an AND array 80 of non-volatile memory cells 210. The operation on the memory cell 210 and with respect to the array 80 is as follows. Let us assume that the operations are with respect to the second floating gate 42.

For the operation of read, the following voltages are applied. The word line 60 is supplied with a voltage of Vdd, such as +3 volts, which is sufficient to turn on the second portion 24 of the channel region 20. The voltage on all unselected word lines are at zero volts. The voltage on the second control gate 52 is zero volts. The voltage applied to the first erase gate 50 is Vpass, or is approximately +6 volts. This voltage is sufficient to turn on the first portion 22 of the channel region 20 irrespective of whether the first floating gate 40 is charged or not. The voltage on the first erase gate 30 and the second erase gate 32 are both applied as Vpass, which is on the order of +3 volts, which is sufficient to cause an induced junction in the substrate 12. The voltages supplied on the second conductivity 16/18 connecting to the induced junctions 16/18 is zero volt for the region 16 (connected to the induced junction 16) and +1 volt connected to the induced injunction 18. Current flow between the regions 16/18 is determined by whether the floating gate 42 is negatively charged or not.

Similarly for the operation of programming using source side injection, the following voltages are applied. The voltage supplied to the word line 60 of the selected memory cell 210 is at Vgp which is on the order of +1.6 volts. All other word lines 60 for the unselected cells 210 are supplied with zero volts. The first control gate 50 is supplied with a voltage of Vpass, which is on the order of +6 volts, which is sufficient to turn on the first portion 22 of the channel region 20 irrespective of whether the first floating gate is negatively charged or not. The second control gate 52 is supplied with a high voltage which is on the order of +11 volts. Both erase gates 30 and 32 are supplied with Vpass which is on the order of +3 volts, which is sufficient to cause the induced junctions 16/18. The second region 16 connecting to the induced junction 16 is supplied with Iprog, which is a programming current while the second region 18 connecting to the induced junction 18 Is supplied with approximately +5 volts. This results in electrons being injected to the second floating gate 42, similar to the source side injection programming method for the programming of the memory cell 10, described heretofore.

For the programming operation of Fowler-Nordheim tunneling, the following voltages are applied. The selected word line 60 is supplied with Vdd, while all other word lines 60 are also held at ground. The second control gate 52 is supplied with a high voltage, such as on the order of +12 volts. The first control gate 50 is supplied with a voltage of Vdd. The second erase gate 32, is supplied with zero volts. While the first erase gate 30 is supplied with +5 volts. Since the second erase gate is supplied with zero volts, no induced junction 18 occurs. Thus, the voltages supplied to the second regions are as follows: zero volts to the second region 16 and floating to the second region 18. As a result, the zero volts supplied to the second region 16 is connected to the induced junction 16 (caused by the application of +5 volts to the first erase gate 30). The high voltage on the second control gate 52 which is capacitively coupled to the second floating gate 42, causes the second floating gate 42 to be raised to a positive voltage inducing the tunneling of electrons from the third portion 26 of the channel region 20 onto the second floating gate 42.

Finally for the operation of erase, the following voltages are applied. Zero volts is applied to the select word line 60 as well as all other unselected word lines 60. Zero volts is also supplied to the first and second control gates 50/52. A high voltage, such as +12 volts is supplied to the first and second erase gates 30/32, causing the formation of induced junctions 16/18. Zero volts is supplied to the second regions 16/18 connected tot eh induced junctions 16/18. In this manner, similar to the discussion for the erase operation of the memory cell 10, although the second floating gate 42 is erased, all other second floating gates 42 in the same column are also erased. Further, the first floating gate 40 in the same selected cell 210 is also erased, along with the first floating gate 40 of all other memory cells 210 in the same column.

Thus, as can be seen from the foregoing, an innovative array of contactless non-volatile memory cells is disclosed.

What is claimed is:

1. An array of contactless non-volatile memory cells comprising:
    a substantially single crystalline semiconductor substrate of a first conductivity type, having a planar surface;
    a plurality of non-volatile memory units arranged in a plurality of rows and columns, each memory unit comprising;
    a first region of a second conductivity type in said substrate along said planar surface;
    a second region of the second conductivity type in said substrate along said planar surface, spaced apart from the first region;
    a channel region between the first region and the second region, said channel region characterized by three portions: a first portion, a second portion and a third portion, with the second portion between the first portion and the third portion, and the first portion adjacent to the first region, and the third portion adjacent to the second region;
    a first floating gate over the first portion, and insulated therefrom;
    a first independently controllable control gate over the first floating gate and capacitively coupled thereto;
    a first independently controllable erase gate over the first region and insulated therefrom;
    an independently controllable word line over the second portion and insulated therefrom;
    a second independently controllable erase gate over the second region and insulated therefrom;
    a second floating gate over the third portion and insulated therefrom; and
    a second independently controllable control gate over the second floating gate and capacitively coupled thereto;
    wherein units in the same row share the word line in common;
    wherein units in the same column share the first region in common to one side, with said first region extended in said substrate from one row to another, the first erase gate in common, the second region in common to the other side, with said second region extended in said substrate from one row to another, and the second erase gate in common;
    wherein units in the same column share the first control gate in common and the second control gate in common; And
    wherein electrical contacts to said array are made only along the extremities of said array to said first region and said second region.

2. The array of claim 1 wherein each memory unit is a single memory cell.

3. The array of claim 1 wherein each memory unit comprises two memory cells and each unit further comprises:
    a third region of the second conductivity type in said substrate along said planar surface, spaced apart from the first region and the second region and is positioned in the second portion;
    wherein a first memory cell in a unit comprises said third region extended to said second region including said first floating gate, said first control gate and said first erase gate, and said second memory cell in the unit comprises said third region extended to said first region, including said second floating gate, said second control gate, and said second erase gate, with the word line being common to both cells.

4. The array of claim 3 wherein cells in the same column share the third region in common, with said third region extending across the substrate.

* * * * *